(12) United States Patent
Randolph

(10) Patent No.: US 6,740,926 B1
(45) Date of Patent: May 25, 2004

(54) PLANAR TRANSISTOR STRUCTURE USING ISOLATION IMPLANTS FOR IMPROVED VSS RESISTANCE AND FOR PROCESS SIMPLIFICATION

(75) Inventor: Mark Randolph, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/032,646

(22) Filed: Dec. 27, 2001

(51) Int. Cl.$^7$ .................................. H01L 29/788

(52) U.S. Cl. .......................... 257/315; 257/316

(58) Field of Search ................. 257/315, 316, 257/374

(56) References Cited

U.S. PATENT DOCUMENTS 5,235,200 A * 8/1993 Komori et al. ............. 257/315

* cited by examiner

*Primary Examiner*—Steven Loke
(74) *Attorney, Agent, or Firm*—Winstead Sechrest & Minick P.C.

(57) ABSTRACT

A planar transistor structure is disclosed that minimizes resistance in the source region and simplifies fabrication of the semiconductor device. The device includes a row of transistors where each transistor includes a stack gate structure and a drain, and a layer of type-2 polysilicon is used to interconnect the transistors in each row. A source region is provided adjacent to the layer of type-2 polysilicon that includes a contact and a N-type junction extending across the source region that provides a planar electrical path between the drains of the transistors and the contact, thereby reducing resistance of the source region.

6 Claims, 3 Drawing Sheets

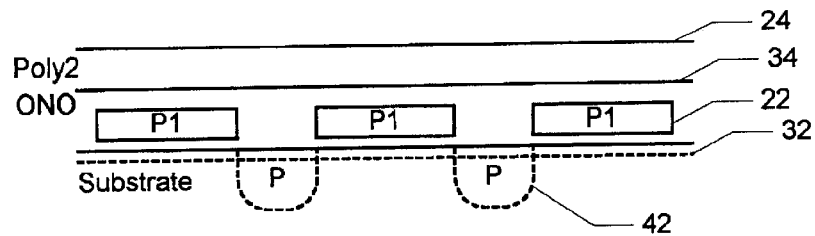
FIG. 4
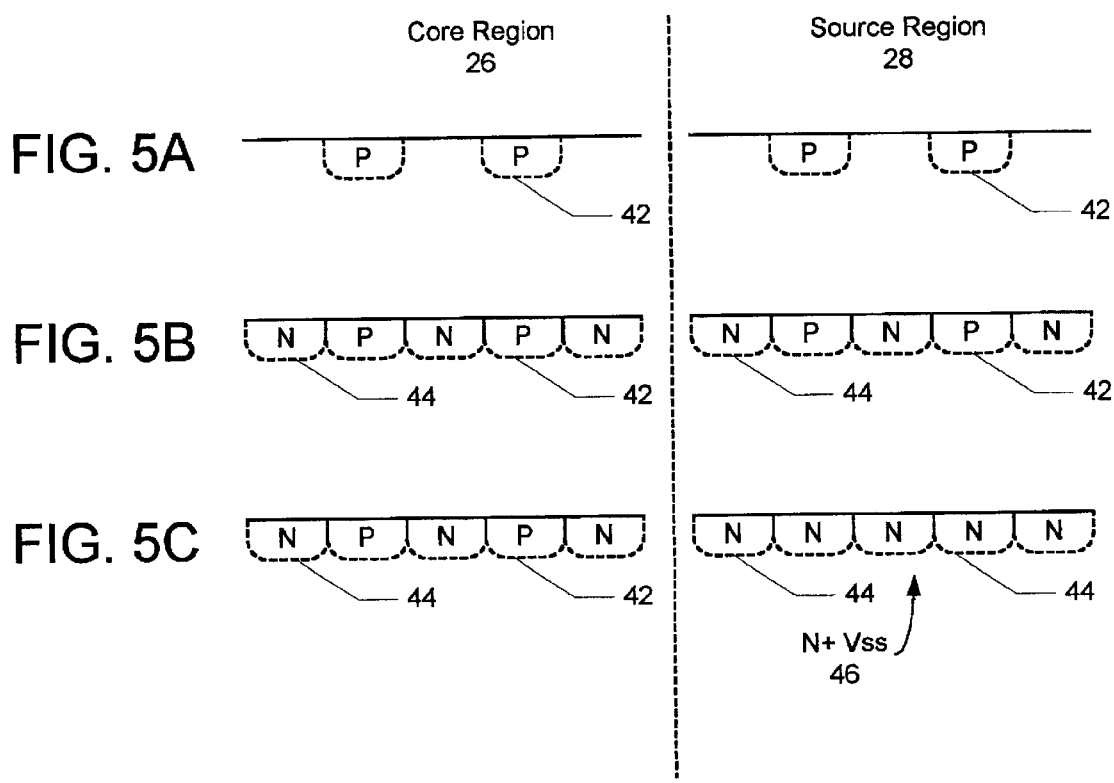

PLANAR TRANSISTOR STRUCTURE USING ISOLATION IMPLANTS FOR IMPROVED VSS RESISTANCE AND FOR PROCESS SIMPLIFICATION

FIELD OF THE INVENTION

The present invention relates to semiconductor processing, and more particularly to a planar transistor structure that minimizes resistance in the source region and simplifies fabrication of the semiconductor device.

BACKGROUND OF THE INVENTION

Shallow trench isolation (STI) technology uses shallow, refilled trenches for isolating devices of the same type as replacements for LOCOS isolation. The process begins by defining columns of active areas for the transistors and isolation areas separating the active areas on the silicon substrate. Recesses are then etched into the isolation areas to form shallow trenches in-between the active areas. An isolation core Vt implant is performed to complete the isolation. After the implant, tunnel oxide is deposited over the silicon substrate and planarized such that it remains only in the trenches. After the tunnel oxide is etched, a layer of type-1 polysilicon (Poly1) is patterned over the source/drain regions to form columns of Poly1. A layer of oxide nitride (ONO) is then deposited over the substrate, followed by a layer of type-2 polysilicon (Poly2). A stack gate mask and etch is then performed to form stacked gate structures for the transistors using the Poly1 and Poly2, and to form word lines interconnecting transistors in each row using the Poly2.

FIG. 1A is a top view of a conventional semiconductor device having a Poly2 stack gate structure. The semiconductor device 10 comprises an array of transistors 12, which are located in active areas 14 of a silicon substrate. The active areas 14 are separated from one another by isolation regions 16. As stated above, shallow trench isolation (STI) is used to isolate the columns of transistors 12 by etching trenches 16 into the substrate 18. Each transistor 12 includes a drain 20 and a base layer of Poly1 22. Each row of transistors 12 is interconnected by a layer of Poly2 24, which also forms the top layer of the stack gate for each transistor 12. Each transistor 12 and its drain 20 are located in the core region 26 of the substrate. A source region 28 lies adjacent to the layer of Poly2 24 that interconnects a particular row of transistors 20. The source region 28 is also referred to as a voltage source-side region (Vss). The drains 20 of the transistors 12 are connected to a Vss contact 30 in the source region 28.

FIG. 1B is a cross-sectional view of the source region 28 of the semiconductor. In the source region 28, the Poly1 22 and Poly1 24 have been removed, leaving only the trenches 16 filled with oxide (not shown) in the isolation region 16. To make an electrical path so that current can flow from the drain 20 to the Vss contact 30, a process called a self aligned source (SAS) etch is performed in the source region 28. During the SAS etch, a Vss etch mask is patterned over the substrate, followed by an oxide etch that removes the oxide from the trenches 16. An implant Vss mask is then patterned over the substrate, followed by a N+ implant, which forms a N+ junction in the source region 28.

Although this process effectively forms an electrical path in the source region 28, the process results in the source region 28 having high resistance for the connection between the drains 20 and the Vss contact 30. In order to adequately isolate the transistors 12, the trenches 16 have to be a certain depth (FIG. 1B). This depth adds a linear length to the electrical path in the N+ junction. In some implementations, as much as 5× is added to the linear dimension. This added linear dimension increases resistance and reduces performance of the transistors 12. In addition, fabrication of the semiconductor device 10 requires two Vss masks; one for the oxide etch and another for the N+ implant, which adds to the number of processing steps and time required to produce the device 10.

An alternative to shallow trench isolation is LOCOS (LOCal Oxidation of Silicon) isolation in which field oxide (FOX) regions are grown in the substrate between the active areas to isolate the transistors. However, the FOX regions are vertically taller than the surrounding substrate, which also would increase the linear length of the electrical path in the source region 28.

Accordingly what is needed is a transistor structure that minimizes the resistance of the source region and simplifies fabrication. The present invention addresses such a need.

SUMMARY OF THE INVENTION

The present invention provides a planar transistor structure that minimizes resistance in the source region and simplifies fabrication of the semiconductor device. The device includes a row of transistors where each transistor includes a stack gate structure and a drain, and a layer of type-2 polysilicon is used to interconnect the transistors in each row. A source region is provided adjacent to the layer of type2 polysilicon that includes a contact and a N-type junction extending across the source region that provides a planar electrical path between the drains of the transistors and the contact.

According to the system and method disclosed herein, the planar source region improves resistance of the source region, and thereby increases overall performance of the semiconductor device.

BRIEF DESCRIPTION OF THE DRAWINGS

FIG. 4 is a cross-sectional view of the core region of substrate during the fabrication process.

FIGS. 5A–5C are cross-sectional views of the semiconductor device showing only the substrate in the core region and the source region.

DETAILED DESCRIPTION

The present invention relates to a method for performing trench isolation during semiconductor device fabrication. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown but is to be accorded the widest scope consistent with the principles and features described herein.

Figure 1A:
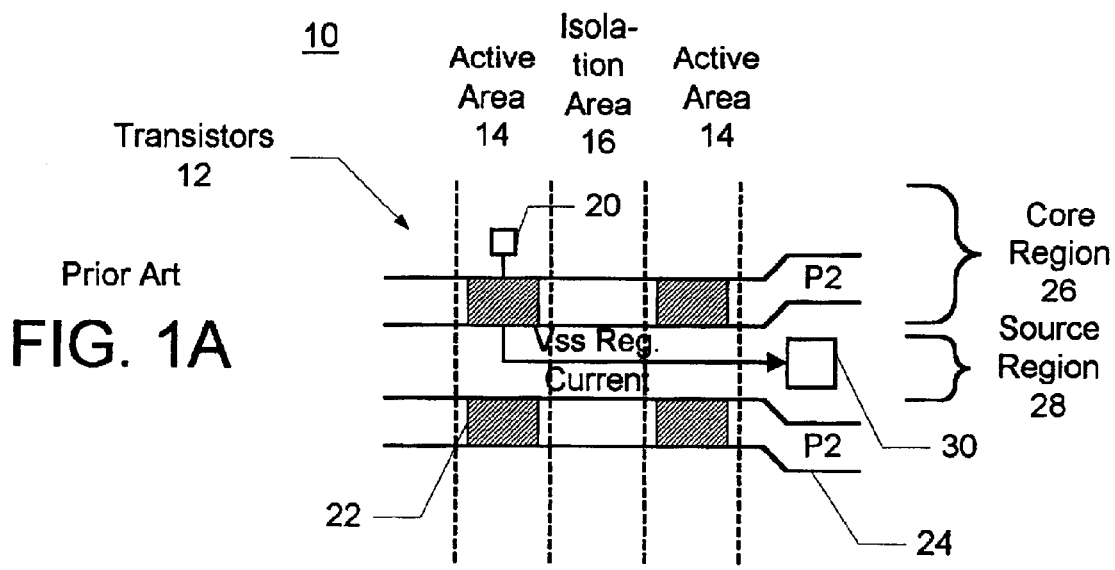
FIG. 1A is a top view of a conventional semiconductor device having a Poly 2 stack gate structure.
Figure 1B:
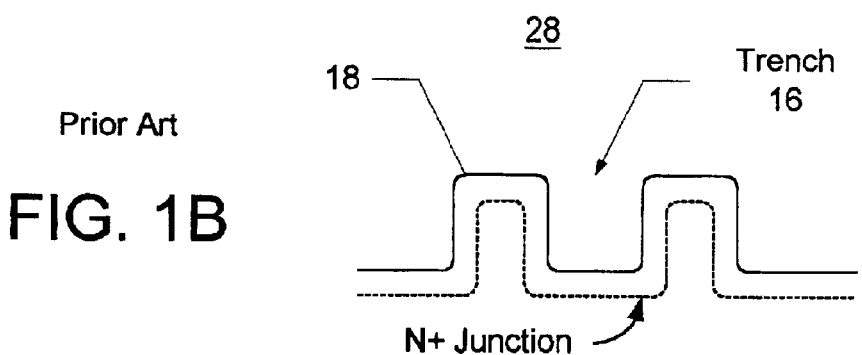
FIG. 1B is a cross-sectional view of the source region of semiconductor.
Figures 2, 3:
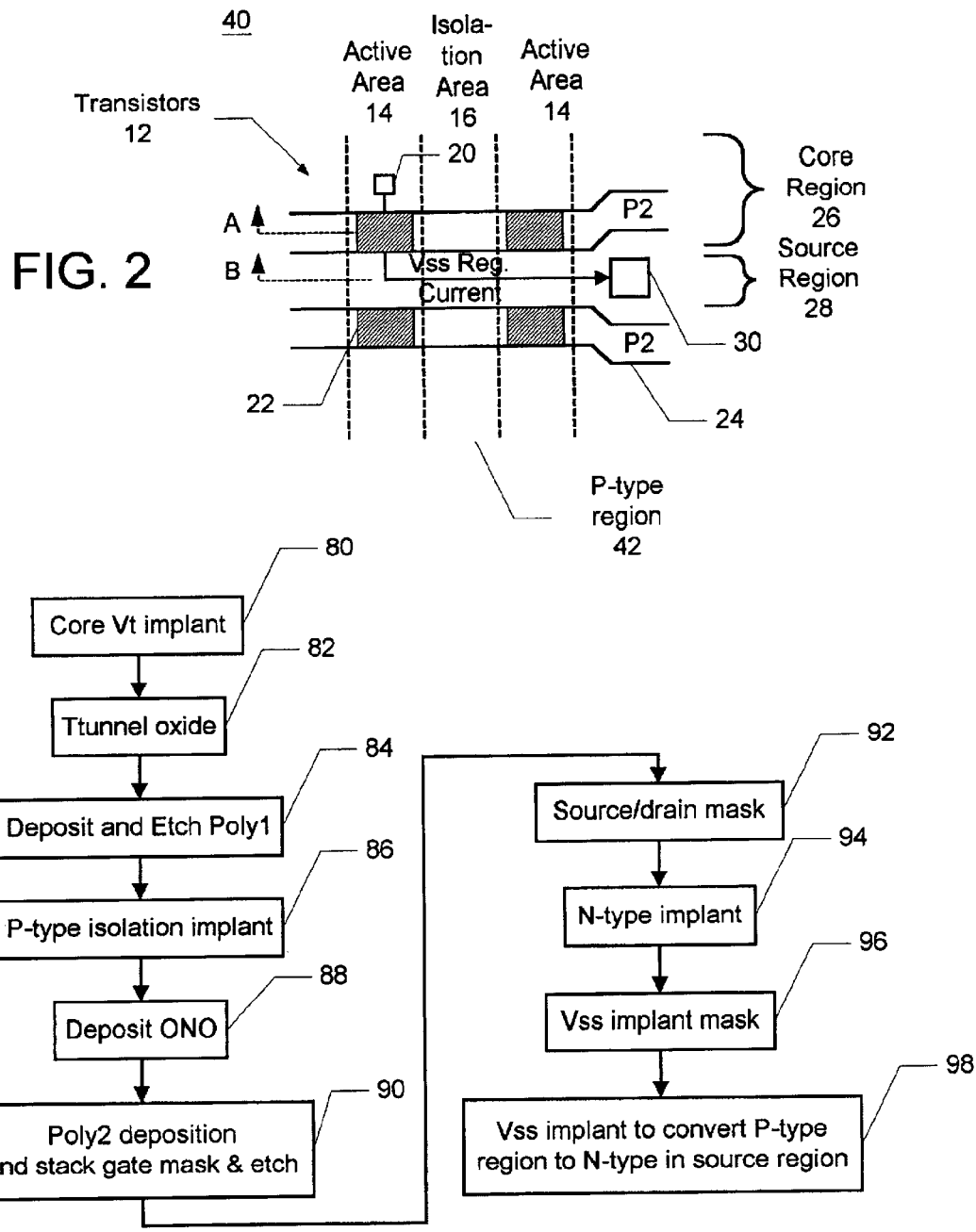
FIG. 2 is a top view of a semiconductor device having a Poly 2 stack gate structure and a low resistance source region in accordance with a preferred embodiment of the present invention.
FIG. 3 is a flow chart illustrating the process for fabricating a semiconductor device having a planar source region in accordance with the preferred embodiment of the present invention.

FIG. 2 is a top view of a semiconductor device having a Poly 2 stack gate structure and a low resistance source region in accordance with a preferred embodiment of the present invention, where like components with FIG. 1 have like reference numerals. FIG. 5C is a cross-sectional view of both the core region 26 of the device along line A, and the source region 28 of the device along line B. As described above, the semiconductor device 40 comprises an array of transistors 12, which are located in active areas 14 of the silicon substrate 18. However, in accordance with the present invention, the use of trenches in the isolation areas 16 has been replaced with a P-type region 42.

As shown in FIG. 5C, in the core region 26, a N-type implant is performed in the active areas 14, creating N-ype junctions 46 under the active areas 14. In the source regions 28, the P+ regions 42 in the isolation areas 16 are converted to N+ regions 44, creating a continuous N-type junction 46 extending across the source region 28. The N-type junction 46 provides a planar electrical path between the drains 20 of the transistors 12 and the Vss contact 30, thereby reducing resistance of the source region 28.

FIG. 3 is a flow chart illustrating the process for fabricating a semiconductor device having a planar source region 2B in accordance with the preferred embodiment of the present invention. FIG. 4 is a cross-sectional view of the core region 26 of substrate during the fabrication process.

Referring to both FIGS. 3 and 4, the process begins by performing a core Vt implant in the core region 26 of the array in step 80. Because shallow trenches are not used for isolation, the steps for etching the trenches have been eliminated. After the implant, tunnel oxide 32 is deposited over the silicon substrate in step 82. A layer of Poly1 22 is then deposited over the substrate and etched to form columns of Poly1 22 over the active areas 14 in step 84. According to the present invention, a P-type isolation implant is then performed using Poly1 22 as the mask to create P-type isolation regions 42 for bitline-to-bitline isolation in step 86. In a preferred embodiment, the P-type implant has a higher doping than that for the core of Vt implant. After the P-type isolation implant, a layer of oxide nitride (ONO) 34 is deposited over the substrate in step 88, followed by a Poly2 24 deposition and stack gate mask and etch in step 90.

In the case where a Poly1 hard mask is used, the P-type isolation implant may be performed after the Poly1 hard mask is patterned. Alternatively, in the case where a Poly1 spacer and etched is performed, the P-type isolation implant may be performed after the Poly1 spacer and etch.

FIGS. 5A–5C are cross-sectional views of the semiconductor device showing only the substrate in the core region 26 and the source region 28. At this point in the process, both the core region 26 and the source region 28 have P-type isolation regions 42, as shown in FIG. 5A.

Referring again to FIG. 3, a source/drain mask is patterned in step 92 with openings for a N-type implant. A N-type implant is then performed in step 94 to form N-type regions 44 under the active areas 14, as shown in FIG. 5B. After the N-type implant, a Vss implant mask is patterned in step 96 for a source side Vss implant. In step 98, a source side Vss implant is then performed to overcompensate the P-type isolation regions into N-type regions 44, creating a continuous N-type junction 46 in the source region 28, as shown in FIG. 5C.

Referring again to FIG. 2, the drains 20 of the transistors are now connected to the Vss contact 30 via the planar source region 28. Because the electrical path in the source region 28 is planar, the resistance of the source region 28 is lower, thereby increasing performance of the transistors 12.

A transistor structure that minimizes resistance in the source region and simplifies fabrication of the semiconductor device has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

What is claimed is:

1. A semiconductor device comprising:

a stacked gate structure;

a first p-type region of substrate disposed adjacent to a first side of the stacked gate structure;

a first n-type region of substrate disposed adjacent to a second side of the stacked gate structure; and a second n-type region of substrate disposed adjacent to the first and second regions, the second n-type region including p-type dopants at a concentration corresponding to the first p-type region.

2. The semiconductor device of claim 1, wherein the second n-type region further comprises n-type dopants at a concentration sufficient to over compensate for the p-type dopants.

3. The semiconductor device of claim 1, wherein the stacked gate structure is located in a core portion of an integrated circuit device.

4. The semiconductor device of claim 1, wherein the stacked gate structure, p-type region, and the first and second n-type regions form a memory cell, and the semiconductor device comprises a plurality of the memory cells.

5. The semiconductor device of claim 4, wherein the memory cells are organized into rows and columns.

6. The semiconductor device of claim 5, wherein p-type regions are disposed between memory cells within a row and first n-type regions are disposed between memory cells within a column.

\* \* \* \* \*